(12) United States Patent
Wu et al.

(10) Patent No.: US 9,672,807 B2
(45) Date of Patent: Jun. 6, 2017

(54) POSITIONING METHOD AND APPARATUS IN THREE-DIMENSIONAL SPACE OF REVERBERATION

(71) Applicant: Tencent Technology (Shenzhen) Company Limited, Shenzhen, Guangdong (CN)

(72) Inventors: Xiayu Wu, Guangdong (CN); Rong Wan, Guangdong (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 0 days.

(21) Appl. No.: 15/110,916

(22) PCT Filed: Jan. 23, 2015

(86) PCT No.: PCT/CN2015/071383
§ 371 (c)(1),
(2) Date: Jul. 11, 2016

(87) PCT Pub. No.: WO2015/110052
PCT Pub. Date: Jul. 30, 2015

(65) Prior Publication Data
US 2016/0336002 A1 Nov. 17, 2016

(30) Foreign Application Priority Data
Jan. 23, 2014 (CN) .......................... 2014 1 0032805

(51) Int. Cl.
*H03G 3/00* (2006.01)
*G10K 15/08* (2006.01)
*G06F 17/50* (2006.01)

(52) U.S. Cl.
CPC ......... *G10K 15/08* (2013.01); *G06F 17/5009* (2013.01)

(58) Field of Classification Search
CPC ............................ G10K 15/08; G06F 17/5009
(Continued)

(56) References Cited

U.S. PATENT DOCUMENTS

| 7,146,296 B1 | 12/2006 | Carlbom et al. |
| 7,563,168 B2 | 7/2009 | Jahnke |

(Continued)

FOREIGN PATENT DOCUMENTS

WO    WO2015/110052 A1    7/2015

OTHER PUBLICATIONS

International Search Report and Written Opinion received in PCT Application No. PCT/CN2015/071383 dated Apr. 29, 2015.

*Primary Examiner* — Paul S Kim
(74) *Attorney, Agent, or Firm* — Brinks Gilson & Lione

(57) ABSTRACT

The present disclosure relates to a positioning method and apparatus in a three-dimensional space of reverberation. The method includes the following steps: constructing a three-dimensional space frame surrounding a point sound source and a sound receiver, and acquiring barycentric coordinates of the three-dimensional space frame; establishing an X-Y coordinate system by using the barycentric coordinates as the origin; determining a vector from the sound receiver to the barycentric coordinates and a facing angle between the sound receiver and the barycentric coordinates according to the established X-Y coordinate system; and obtaining reverberation intensity through calculation according to the vector from the sound receiver to the barycentric coordinates and the facing angle between the sound receiver and the barycentric coordinates, and using the reverberation intensity as a control parameter.

10 Claims, 4 Drawing Sheets

(58) Field of Classification Search
USPC .................................. 381/63, 61, 56, 58, 66
See application file for complete search history.

(56) References Cited

U.S. PATENT DOCUMENTS

2009/0180624 A1* 7/2009 Nakayama .............. A63F 13/10
                                                          381/17
2010/0119075 A1   5/2010 Xiang et al.

* cited by examiner

POSITIONING METHOD AND APPARATUS IN THREE-DIMENSIONAL SPACE OF REVERBERATION

This application is a National Stage application of PCT international application PCT/CN2015/071383, filed on Jan. 23, 2015, which claims priority to Chinese Patent Application No. 201410032805.4, filed on Jan. 23, 2014, both of which are incorporated by reference in their entirety.

FIELD OF THE TECHNOLOGY

The present disclosure relates to audio processing technologies, and in particular, to a positioning method and apparatus in a three-dimensional space of reverberation.

BACKGROUND OF THE DISCLOSURE

When propagating indoors, a sound wave is reflected by obstacles such as walls, ceiling, and floor, and is partially absorbed by an obstacle during each time of reflection. In this way, when a sound source stops, a sound wave disappears only after a large number of times of reflection and absorption indoors, and human ears perceive that the sound lasts a period of time after the sound source stops. Such a phenomenon is reverberation.

There are mainly two conventional manners of implementing a reverberation effect in a three-dimensional space. In the first manner, according to the volume of a three-dimensional space, a fixed reverberation response parameter and a sending amount of a reverb effects unit are set. This manner cannot obtain a changing reverberation effect according to the position of a point sound source, that is, cannot obtain a high simulation effect. In the second manner, a sound source is used to emit positioning rays circumferentially. When a ray hits a volume frame of a current three-dimensional space, the position of the sound source in the current three-dimensional space is obtained through measurement. A reverberation parameter or a sending amount from a channel of the sound source to a reverb effects unit are adjusted according to a setting. However, rays need to be continuously sent to measure the position of a point sound source in a three-dimensional space, resulting in very high consumption of resources, and a sound receiver can only hear a reflection result from one surface, which fails to meet physical laws of sound reflection in a real three-dimensional environment. For example, when one point sound source is located on any surface of a cube, the physical laws of reverberant reflection of a sound are that no reverberant reflection occurs on the current surface where the sound source is located, and the opposite surface has maximum reverberant reflection. The manner of using the sound source to emit positioning rays circumferentially fails to obtain a reverberant reflection value that meets physical laws, that is, a simulation effect is not high.

SUMMARY

In view of this, it is necessary to provide a positioning method in a three-dimensional space of reverberation that can improve accuracy of simulation to solve a problem of low accuracy of simulation in a conventional manner of implementing a reverberation effect in a three-dimensional space.

In addition, it is further necessary to provide a positioning apparatus in a three-dimensional space of reverberation that can improve accuracy of simulation.

A positioning method in a three-dimensional space of reverberation includes the following steps:

constructing a three-dimensional space frame surrounding a point sound source and a sound receiver, and acquiring barycentric coordinates of the three-dimensional space frame;

establishing an X-Y coordinate system by using the barycentric coordinates as the origin;

determining a vector from the sound receiver to the barycentric coordinates and a facing angle between the sound receiver and the barycentric coordinates according to the established X-Y coordinate system; and obtaining reverberation intensity through calculation according to the vector from the sound receiver to the barycentric coordinates and the facing angle between the sound receiver and the barycentric coordinates, and using the reverberation intensity as a control parameter.

A positioning apparatus in a three-dimensional space of reverberation includes:

a barycentric coordinates determining module, configured to construct a three-dimensional space frame surrounding a point sound source and a sound receiver, and acquire barycentric coordinates of the three-dimensional space frame;

a coordinate system establishing module, configured to establish an X-Y coordinate system by using the barycentric coordinates as the origin;

a sound receiver positioning module, configured to determine a vector from the sound receiver to the barycentric coordinates and a facing angle between the sound receiver and the barycentric coordinates according to the established X-Y coordinate system; and a parameter acquiring module, configured to obtain reverberation intensity through calculation according to the vector from the sound receiver to the barycentric coordinates and the facing angle between the sound receiver and the barycentric coordinates, and use the reverberation intensity as a control parameter.

In the foregoing positioning method in a three-dimensional space of reverberation, a three-dimensional space frame surrounding a point sound source and a sound receiver is constructed, and an X-Y coordinate system is established by using barycentric coordinates of the three-dimensional space frame as the origin, a vector from the sound receiver to the barycentric coordinates and a facing angle between the sound receiver and the barycentric coordinates are determined, calculation is performed to obtain reverberation intensity, and the reverberation intensity is used as a reverberation control parameter for the position of the sound receiver, thereby achieving a simulated reverberation effect in a three-dimensional space; and a facing direction of the sound receiver in the three-dimensional space is determined in real time according to the position of the sound receiver in the three-dimensional space, thereby obtaining a real-time reverberation effect and improving accuracy of simulation.

DESCRIPTION OF EMBODIMENTS

To make the objectives, technical solutions, and advantages in the present disclosure clearer, the following further describes the present disclosure in detail with reference to the accompanying drawings and embodiments. It should be understood that the specific embodiments described herein are merely used for describe the present disclosure, rather than to limit the present disclosure.

Unless the context clearly indicates otherwise, singular elements or components in the present disclosure may be in the plural and vice versa, which is not limited in the present disclosure. Although steps in the present disclosure are labeled with numbers, such numbers are not intended to limit the order of these steps. Unless the order of steps is explicitly stated or it is explicitly stated that a step needs to be performed on the basis of another step, the relative order of steps can be adjusted. It should be understood that as used herein, the term "and/or" involves and includes any and all combinations of one or more of the associated listed items.

Figure 1:
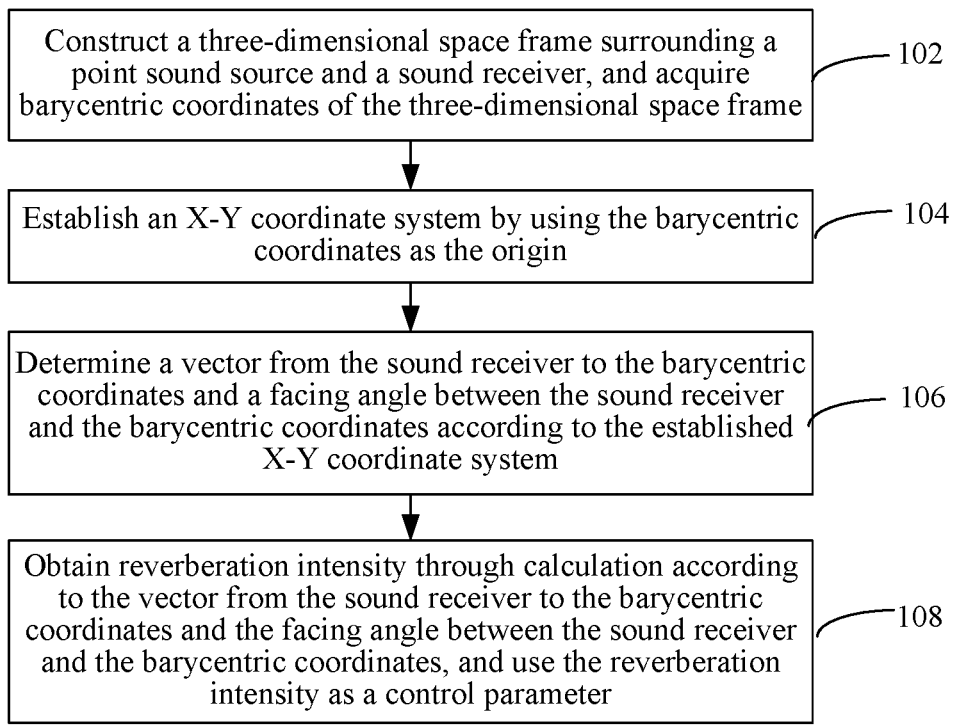
FIG. 1 is a flowchart of a positioning method in a three-dimensional space of reverberation in an embodiment.

FIG. 1 is a flowchart of a positioning method in a three-dimensional space of reverberation in an embodiment. As shown in FIG. 1, the positioning method in a three-dimensional space of reverberation includes the following steps:

Step 102: Construct a three-dimensional space frame surrounding a point sound source and a sound receiver, and acquire barycentric coordinates of the three-dimensional space frame.

Specifically, the point sound source refers to a point vibration source that emits a sound. The constructed three-dimensional space frame may be a cube, a cuboid, or the like. The barycentric coordinates are coordinates defined in simplicial vertices. It is assumed that $V_1, V_2, \ldots, V_n$ is one simplicial vertex in a vector space V. If a point p in V meets: $(\lambda_1+\lambda_2+ \ldots +\lambda_n)p=\lambda_1 V_1+\lambda_2 V_2+ \ldots +\lambda_n V_n$, $(\lambda_1, \lambda_2, \ldots, \lambda_n)$ is the barycentric coordinates of p relative to $V_1, V_2, \ldots, V_n$, where the coordinates of vertices are $(1, 0, \ldots, 0), (0, 1, \ldots, 0), \ldots,$ and $(0, 0, \ldots, 1)$, respectively. The barycentric coordinates of the three-dimensional space frame may be obtained through calculation in the foregoing manner.

Step 104: Establish an X-Y coordinate system by using the barycentric coordinates as the origin.

Specifically, the value of an X axis coordinate denotes a distance between the sound receiver and the barycentric coordinates, and the value of a Y axis coordinate denotes a facing angle between the sound receiver and the barycentric coordinates.

Step 106: Determine a vector from the sound receiver to the barycentric coordinates and the facing angle between the sound receiver and the barycentric coordinates according to the established X-Y coordinate system.

Step 108: Obtain reverberation intensity through calculation according to the vector from the sound receiver to the barycentric coordinates and the facing angle between the sound receiver and the barycentric coordinates, and use the reverberation intensity as a control parameter.

In the foregoing positioning method in a three-dimensional space of reverberation, a three-dimensional space frame surrounding the point sound source and a sound receiver is constructed, and an X-Y coordinate system is established by using barycentric coordinates of the three-dimensional space frame as the origin, the vector from the sound receiver to the barycentric coordinates and a facing angle between the sound receiver and the barycentric coordinates are determined, reverberation intensity is obtained through calculation, and the reverberation intensity is used as a reverberation control parameter for the position of the sound receiver, thereby achieving a simulated reverberation effect in a three-dimensional space; a facing direction of the sound receiver in the three-dimensional space is determined in real time according to the position of the sound receiver in the three-dimensional space, thereby obtaining a real-time reverberation effect and improving the accuracy of simulation.

Figure 2:
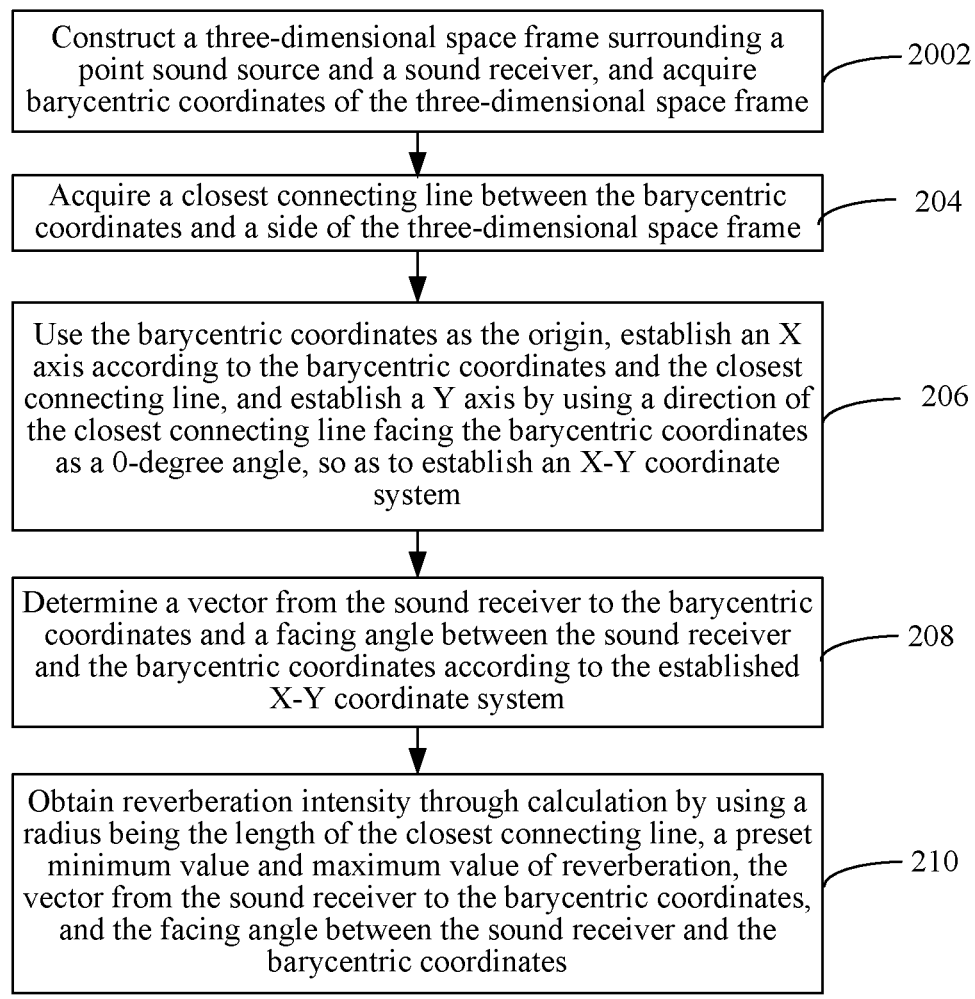
FIG. 2 is a flowchart of a positioning method in a three-dimensional space of reverberation in an embodiment.

FIG. 2 is a flowchart of a positioning method in a three-dimensional space of reverberation in another embodiment. As shown in FIG. 2, the positioning method in a three-dimensional space of reverberation includes the following steps:

Step 202: Construct a three-dimensional space frame surrounding a point sound source and a sound receiver, and acquire barycentric coordinates of the three-dimensional space frame.

Specifically, the point sound source refers to a point vibration source that emits a sound. The constructed three-dimensional space frame may be a cube, a cuboid, or the like. The coordinates of the point sound source may be directly denoted in a 3D image engine.

Step 204: Acquire a closest connecting line between the barycentric coordinates and a side of the three-dimensional space frame.

Specifically, the side of the three-dimensional space frame refers to a surface. For example, the three-dimensional space frame is a cube, and the side is one of the 12 surfaces of the cube.

Step 206: Use the barycentric coordinates as the origin, establish an X axis according to the barycentric coordinates and the closest connecting line, and establish a Y axis by using a direction of the closest connecting line facing the barycentric coordinates as a 0-degree angle, so as to establish an X-Y coordinate system.

Specifically, the value of an X axis coordinate denotes a distance between the sound receiver and the barycentric coordinates, and the value of a Y axis coordinate denotes a facing angle between the sound receiver and the barycentric coordinates.

Step 208: Determine the vector from the sound receiver to the barycentric coordinates and a facing angle between the sound receiver and the barycentric coordinates according to the established X-Y coordinate system.

Step 210: Obtain reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates.

A formula of obtaining reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates is:

$$Q=((|L|/R*(MaxRev-MinRev)*L/LdotD)+MinRev)/MaxRev$$

where Q denotes the reverberation intensity, L denotes the vector from the sound receiver to the barycentric coordinates, R denotes the radius being the length of the closest connecting line, MaxRev denotes the preset reverberation maximum value, MinRev denotes the preset reverberation minimum value, dot denotes a dot product, and D denotes the facing angle between the sound receiver and the barycentric coordinates (that is, a vector of a direction in which the sound receiver faces).

Step 204 and step 206 in the foregoing may be specific steps of step 104.

In conclusion, in the foregoing positioning method in a three-dimensional space of reverberation, a three-dimensional space frame surrounding a point sound source and a sound receiver is constructed, and barycentric coordinates of the three-dimensional space frame are used as the origin, a closest connecting line between the barycentric coordinates and a side of the three-dimensional space frame is acquired, an X axis according to the barycentric coordinates and the closest connecting line is established, and a Y axis by using a direction of the closest connecting line facing the barycentric coordinates as a 0-degree angle is established, so as to establish an X-Y coordinate system, a vector from the sound receiver to the barycentric coordinates and the facing angle between the sound receiver and the barycentric coordinates are determined, reverberation intensity is obtained through calculation according to preset minimum value and maximum value of reverberation, the vector from the sound receiver to the barycentric coordinates, and the facing angle between the sound receiver and the barycentric coordinates, and the reverberation intensity is used as a reverberation control parameter for the position of the sound receiver, thereby achieving a simulated reverberation effect in a three-dimensional space; a facing direction of the sound receiver in the three-dimensional space is determined in real time according to the position of the sound receiver in a three-dimensional space, thereby obtaining a real-time reverberation effect; and therefore, a better reverberation effect is achieved when the sound receiver faces a point sound source, while a reverberation effect is poorer when the sound receiver has the back towards the point sound source, which meets physical laws in real reverberant reflection, thereby improving accuracy of simulation.

In an embodiment, the foregoing positioning method in a three-dimensional space of reverberation further includes: inputting the reverberation intensity as a control parameter into a reverb effects unit or a vocoder or a delay effects unit. Control of a variety of effects units may be implemented.

It may be understood that after the distance between the sound receiver and the barycentric coordinates and an angular value of the facing angle between the sound receiver and the barycentric coordinates are determined, the distance between the sound receiver and the barycentric coordinates may be used as a side and substituted in a preset trigonometric function to obtain trigonometric function coordinates of the sound receiver, and then the reverberation intensity is obtained through calculation according to a trigonometric function formula.

Figure 3:
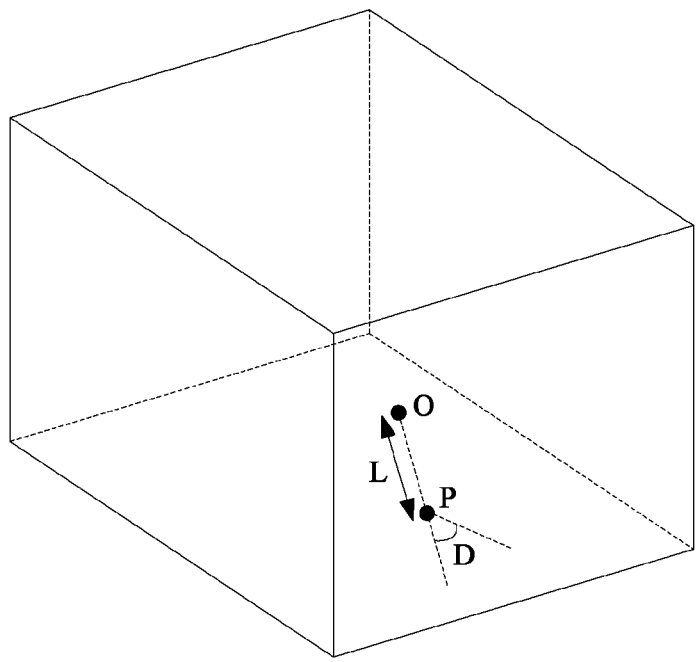
FIG. 3 is a schematic diagram of a specific application of the foregoing positioning method in a three-dimensional space of reverberation.

FIG. 3 is a schematic diagram of a specific application of the foregoing positioning method in a three-dimensional space of reverberation. In FIG. 3, it is constructed that a barycentric coordinate point of a three-dimensional space frame is a point O, the barycentric coordinate point is used as the origin, a closest connecting line between the barycentric coordinates and a side of a cube is acquired, an X axis is established, a Y axis is established by using an angle from the closest connecting line towards the barycentric coordinates being 0 degree, where a sound receiver is a point P, a vector OP from the sound receiver point P to the barycentric coordinates O is L, a facing angle between the sound receiver P and the barycentric coordinates O is D, and then reverberation intensity is obtained through calculation according to a preset maximum value and minimum value of reverberation and L and D.

Figure 4:
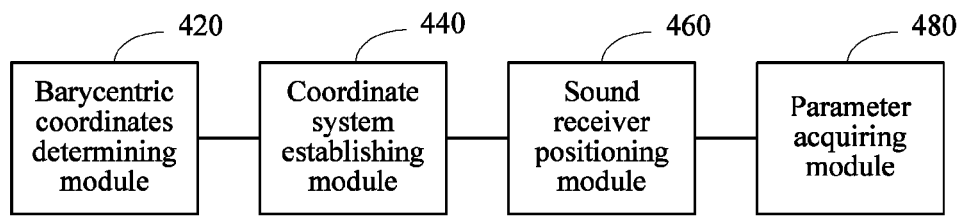
FIG. 4 is a structural block diagram of a positioning apparatus in a three-dimensional space of reverberation in an embodiment.

FIG. 4 is a structural block diagram of a positioning apparatus in a three-dimensional space of reverberation in an embodiment. The positioning apparatus in a three-dimensional space of reverberation includes a barycentric coordinates determining module 420, a coordinate system establishing module 440, a sound receiver positioning module 460, and a parameter acquiring module 480. Where:

The barycentric coordinates determining module 420 is configured to construct a three-dimensional space frame surrounding a point sound source and a sound receiver, and acquire barycentric coordinates of the three-dimensional space frame.

Specifically, the point sound source refers to a point vibration source that emits a sound. The constructed three-dimensional space frame may be a cube, a cuboid, or the like.

The coordinate system establishing module 440 is configured to establish an X-Y coordinate system by using the barycentric coordinates as the origin.

Specifically, the value of an X axis coordinate denotes a distance between the sound receiver and the barycentric coordinates, and the value of a Y axis coordinate denotes a facing angle between the sound receiver and the barycentric coordinates.

Figure 5:
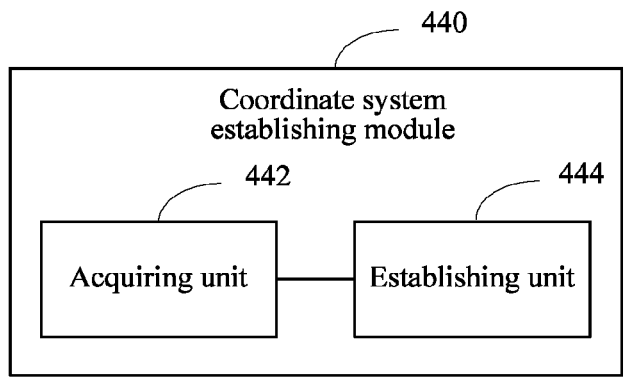
FIG. 5 is a structural block diagram of the inside of a coordinate system establishing module in an embodiment.

FIG. 5 is a structural block diagram of the inside of a coordinate system establishing module in an embodiment. The coordinate system establishing module 440 includes an acquiring unit 442 and an establishing unit 444.

The acquiring unit 442 is configured to acquire a closest connecting line between the barycentric coordinates and a side of the three-dimensional space frame.

Specifically, the side of a three-dimensional space frame refers to a surface. For example, the three-dimensional space frame is a cube, and the sides are the 12 surfaces of the cube.

The establishing unit 444 is configured to use the barycentric coordinates as the origin, establish an X axis according to the barycentric coordinates and the closest connecting line, and establish a Y axis by using a direction of the closest connecting line facing the barycentric coordinates as a 0-degree angle, so as to establish an X-Y coordinate system.

The sound receiver positioning module 460 is configured to determine a vector from the sound receiver to the barycentric coordinates and a facing angle between the sound receiver and the barycentric coordinates according to the established X-Y coordinate system.

The parameter acquiring module 480 is configured to obtain the reverberation intensity through calculation according to the vector from the sound receiver to the barycentric coordinates and the facing angle between the sound receiver and the barycentric coordinates, and use the reverberation intensity as a control parameter.

the parameter acquiring module 480 is further configured to obtain the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates.

A formula of obtaining the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates is:

$$Q=((|L|/R*(\text{MaxRev}-\text{MinRev})*L/L\text{dot}D)+\text{MinRev})/\text{MaxRev}$$

where Q denotes the reverberation intensity, L denotes the vector from the sound receiver to the barycentric coordinates, R denotes the radius being the length of the closest connecting line, MaxRev denotes the preset reverberation maximum value, MinRev denotes the preset reverberation minimum value, dot denotes a dot product, and D denotes the facing angle between the sound receiver and the barycentric coordinates.

Figure 6:
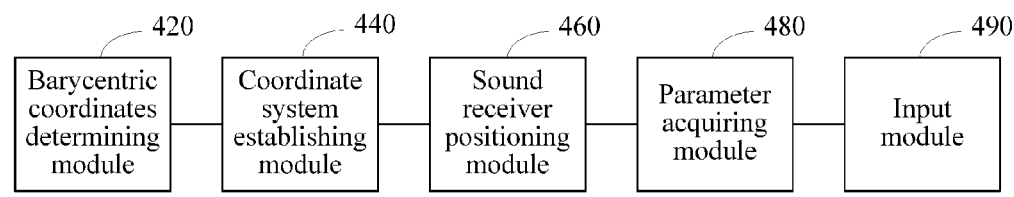
FIG. 6 is a structural block diagram of a positioning apparatus in a three-dimensional space of reverberation in another embodiment.

FIG. 6 is a structural block diagram of a positioning apparatus in a three-dimensional space of reverberation in another embodiment. The positioning apparatus in a three-dimensional space of reverberation includes a barycentric coordinates determining module 420, a coordinate system establishing module 440, a sound receiver positioning module 460, and a parameter acquiring module 480, and further includes an input module 490.

The input module 490 is configured to input reverberation intensity as a control parameter into a reverb effects unit or a vocoder or a delay effects unit.

In conclusion, in the foregoing positioning apparatus in a three-dimensional space of reverberation, a three-dimensional space frame surrounding a point sound source and a sound receiver is constructed, and barycentric coordinates of the three-dimensional space frame are used as the origin, a closest connecting line between the barycentric coordinates and a side of the three-dimensional space frame is acquired, an X axis according to the barycentric coordinates and the closest connecting line is established, and a Y axis by using a direction of the closest connecting line facing the barycentric coordinates as a 0-degree angle is established, so as to establish an X-Y coordinate system, a vector from the sound receiver to the barycentric coordinates and the facing angle between the sound receiver and the barycentric coordinates are determined, reverberation intensity is obtained through calculation according to preset minimum value and maximum value of reverberation, the vector from the sound receiver to the barycentric coordinates, and the facing angle between the sound receiver and the barycentric coordinates, and the reverberation intensity is used as a reverberation control parameter for the position of the sound receiver, thereby achieving a simulated reverberation effect in a three-dimensional space; a facing direction of the sound receiver in the three-dimensional space is determined in real time according to the position of the sound receiver in a three-dimensional space, thereby obtaining a real-time reverberation effect; and therefore, a better reverberation effect is achieved when the sound receiver faces a point sound source, while a reverberation effect is poorer when the sound receiver has the back towards the point sound source, which meets physical laws in real reverberant reflection, thereby improving accuracy of simulation.

It may be understood that after the distance between the sound receiver and the barycentric coordinates and an angular value of the facing angle between the sound receiver and the barycentric coordinates are determined, the parameter acquiring module 480 may use the distance between the sound receiver and the barycentric coordinates as a side and substitute the distance in a preset trigonometric function to obtain trigonometric function coordinates of the sound receiver, and then obtain the reverberation intensity through calculation according to a trigonometric function formula.

Figure 7:
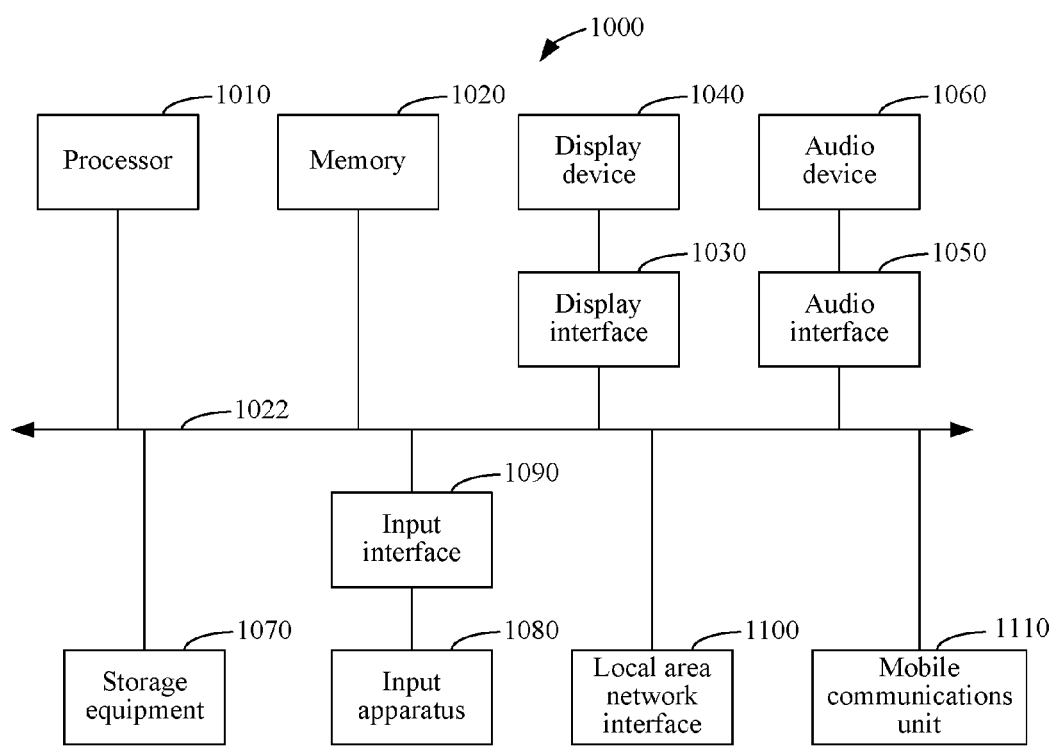
FIG. 7 is a modular diagram of a computer system that can implement an embodiment of the present invention.

FIG. 7 is a block diagram of a computer system 1000 that can implement the embodiments of the present invention. The computer system 1000 is merely an example of computer environments applicable to the present disclosure, and should not be construed as any limitation on the application scope of the present disclosure. The computer system 1000 also should not be interpreted as needing to rely on or have one or a combination of parts of the exemplary computer system 1000 shown in FIG. 7.

The computer system 1000 shown in FIG. 7 is an example of computer systems suitable for use in the present disclosure. Other architectures having different subsystem configurations may also be used. For example, well-known devices such as a desktop computer, a notebook computer, a personal digital assistant, a smart phone, a tablet computer are applicable to some embodiments of the present invention, but the present disclosure is not limited thereto.

As shown in FIG. 7, the computer system 1000 includes a processor 1010, a memory 1020 and a system bus 1022. Various system components including the memory 1020 and the processor 1010 are connected to the system bus 1022. The processor 1010 is hardware for executing computer program instructions by means of basic arithmetic and logic operations in the computer system. The memory 1020 is a physical device for temporarily or permanently storing computer programs or data (for example, program state information). The system bus 1022 may be any one of the following types of bus structures: a memory bus or memory controller, a peripheral bus and a local bus. The processor 1010 and the memory 1020 can perform data communication through the system bus 1022. The memory 1020 includes a read-only memory (ROM) or a flash memory (both not shown), and a random access memory (RAM), where the RAM generally refers to main memory loaded with an operating system and application programs.

The computer system 1000 further includes a display interface 1030 (for example, a graphics processing unit), a display device 1040 (for example, a liquid crystal display), an audio interface 1050 (for example, a sound card) and an audio device 1060 (for example, a loudspeaker). The display device 1040 and the audio device 1060 are media devices for presenting multimedia content.

The computer system 1000 generally includes one storage device 1070. The storage device 1070 may be selected from multiple types of computer readable media. The computer readable media refer to any available media that can be accessed by the computer system 1000, and include removable media and non-removable media. For example, the computer readable media include, but not limited to, a flash memory (micro SD card), a CD-ROM, a digital versatile disc (DVD) or other optical storage, a cassette, a magnetic tape, a disk storage or other magnetic storage devices, or any other media that can be used to store required information and can be accessed by the computer system 1000.

The computer system 1000 further includes an input device 1080 and an input interface 1090 (for example, an IO controller). A user may input an instruction and information into the computer system 1000 by using the input device 1080, such as a keyboard, a mouse or a touch panel device on the display device 1040. The input device 1080 is generally connected to the system bus 1022 through the input interface 1090, but may also be connected through other interfaces or bus structures, such as a universal serial bus (USB).

The computer system 1000 may be logically connected to one or more network devices in a network environment. The network device may be a personal computer, a server, a router, a smart phone, a tablet computer or other public network nodes. The computer system 1000 is connected to the network device through a local area network (LAN) interface 1100 or a mobile communications unit 1110. A local area network (LAN) refers to an interconnected computer network in a limited area such as a family, a school, a computer laboratory, or an office building using network media. WiFi and Ethernet over twisted pair are the most commonly used two technologies for building a local area network. WiFi is a technology that enables the computer systems 1000 to exchange data or to be connected to a wireless network through radio waves. The mobile communications unit 1110 is capable of making and receiving calls through radio communications lines while moving in a broad geographic area. In addition to calling, the mobile communications unit 1110 also supports Internet access in a 2G, 3G or 4G cellular communications system that provides mobile data services.

It should be noted that other computer systems including more or fewer subsystems than those of the computer system 1000 are also applicable to the present disclosure. For example, the computer system 1000 may include a Bluetooth unit capable of exchanging data in a short distance, an image sensor for capturing images, and an accelerometer for measuring the acceleration.

As described above in detail, the computer system 1000 applicable to the present disclosure can execute specified operations in the positioning method in a three-dimensional space of reverberation. The computer system 1000 executes these operations in the form of running software instructions in the computer readable media by the processor 1010. These software instructions may be read into the memory 1020 from the storage device 1070 or from another device through the local area network interface 1100. The software instructions stored in the memory 1020 enable the processor 1010 to execute the positioning method in a three-dimensional space of reverberation. Moreover, the present disclosure may also be implemented by using a hardware circuit or by using a combination of a hardware circuit and software instructions. Therefore, the implementation of the present disclosure is not limited to any particular combination of a hardware circuit and software.

The foregoing embodiments only describe several implementation manners of the present disclosure, and their description is specific and detailed, but cannot therefore be understood as a limitation to the patent scope of the present disclosure. It should be noted that, a person of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A positioning method in a three-dimensional space of reverberation, including the following steps:
   constructing, by a processor, a three-dimensional space frame surrounding a point sound source and a sound receiver, and acquiring, by the processor, barycentric coordinates of the three-dimensional space frame;
   establishing, by the processor, an X-Y coordinate system by using the barycentric coordinates as the origin;
   determining, by the processor, a vector from the sound receiver to the barycentric coordinates and a facing angle between the sound receiver and the barycentric coordinates according to the established X-Y coordinate system; and
   obtaining, by the processor, reverberation intensity through calculation according to the vector from the sound receiver to the barycentric coordinates and the facing angle between the sound receiver and the barycentric coordinates, and using the reverberation intensity as a control parameter.

2. The method according to claim 1, wherein the step of establishing, by the processor, an X-Y coordinate system by using the barycentric coordinates as the origin includes:
   acquiring, by the processor, a closest connecting line between the barycentric coordinates and a side of the three-dimensional space frame; and
   using, by the processor, the barycentric coordinates as the origin, establishing, by the processor, an X axis according to the barycentric coordinates and the closest connecting line, and establishing, by the processor, a Y axis by using direction of the closest connecting line facing the barycentric coordinates as a 0-degree angle, so as to establish the X-Y coordinate system.

3. The method according to claim 2, wherein the step of obtaining, by the processor, reverberation intensity through calculation according to the vector from the sound receiver to the barycentric coordinates and the facing angle between the sound receiver and the barycentric coordinates includes:
   obtaining, by the processor, the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates.

4. The method according to claim 3, wherein, a formula of obtaining the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates is:

$$Q=((|L|/R*(\text{MaxRev}-\text{MinRev})*L/L\text{dot}D)+\text{MinRev})/\text{MaxRev}$$

wherein Q denotes the reverberation intensity, L denotes the vector from the sound receiver to the barycentric coordinates, R denotes the radius being the length of the closest connecting line, MaxRev denotes the preset reverberation maximum value, MinRev denotes the preset reverberation minimum value, dot denotes a dot product, and D denotes the facing angle between the sound receiver and the barycentric coordinates.

5. The method according to claim 1, wherein the method further includes:
   inputting, by the processor, the reverberation intensity as the control parameter into a reverb effects unit or a vocoder or a delay effects unit.

6. A positioning apparatus in a three-dimensional space of reverberation, including a processor and a non-transitory storage medium having a plurality of instructions stored thereon that, when executed by the processor, cause the processor to:
  construct a three-dimensional space frame surrounding a point sound source and a sound receiver, and acquire barycentric coordinates of the three-dimensional space frame;
  establish an X-Y coordinate system by using the barycentric coordinates as the origin;
  determine a vector from the sound receiver to the barycentric coordinates and a facing angle between the sound receiver and the barycentric coordinates according to the established X-Y coordinate system; and
  obtain reverberation intensity through calculation according to the vector from the sound receiver to the barycentric coordinates and the facing angle between the sound receiver and the barycentric coordinates, and use the reverberation intensity as a control parameter.

7. The apparatus according to claim 6, wherein the instructions further causes the processor to:
  acquire a closest connecting line between the barycentric coordinates and a side of the three-dimensional space frame;
  use the barycentric coordinates as the origin, establish an X axis according to the barycentric coordinates and the closest connecting line, and establish a Y axis by using a direction of the closest connecting line facing the barycentric coordinates as a 0-degree angle, so as to establish the X-Y coordinate system.

8. The apparatus according to claim 7, wherein the instructions further causes the processor to obtain the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates.

9. The apparatus according to claim 8, wherein a formula of obtaining the reverberation intensity through calculation by using a radius being the length of the closest connecting line, a preset minimum value and maximum value of reverberation, and the vector from the sound receiver to the barycentric coordinates and the facing angle between the sound receiver and the barycentric coordinates is:

$$Q=((|L|/R*(MaxRev-MinRev)*L/LdotD)+MinRev)/MaxRev$$

wherein Q denotes the reverberation intensity, L denotes the vector from the sound receiver to the barycentric coordinates, R denotes the radius being the length of the closest connecting line, MaxRev denotes the preset reverberation maximum value, MinRev denotes the preset reverberation minimum value, dot denotes a dot product, and D denotes the facing angle between the sound receiver and the barycentric coordinates.

10. The apparatus according to claim 6, wherein the instructions further causes the processor to:
  input the reverberation intensity as the control parameter into a reverb effects unit or a vocoder or a delay effects unit.

* * * * *